United States Patent
Kokkonen (10) Patent No.: US 10,970,227 B2
(45) Date of Patent: Apr. 6, 2021

(54) DATA PROCESSING APPARATUS FOR HANDLING PAGE FAULT USING PREDEFIND BIT PATTERNS AND A METHOD THEREOF

(71) Applicant: Huawei Technologies Co., Ltd., Shenzhen (CN)

(72) Inventor: Jani Kokkonen, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 23 days.

(21) Appl. No.: 15/948,393

(22) Filed: Apr. 9, 2018

(65) Prior Publication Data

US 2018/0225223 A1    Aug. 9, 2018

Related U.S. Application Data

(63) Continuation of application No. PCT/EP2016/066529, filed on Jul. 12, 2016.

(30) Foreign Application Priority Data

Oct. 8, 2015 (EP) .................................. 15188863

(51) Int. Cl.
    *G06F 12/1009* (2016.01)
    *G06F 12/109* (2016.01)
    (Continued)

(52) U.S. Cl.
    CPC .......... *G06F 12/1009* (2013.01); *G06F 12/08* (2013.01); *G06F 12/109* (2013.01); *G11C 29/44* (2013.01); *G11C 2029/1208* (2013.01)

(58) Field of Classification Search
    CPC .... G06F 12/1009; G06F 12/109; G06F 12/08; G11C 29/44; G11C 2029/1208
    (Continued)

(56) References Cited

U.S. PATENT DOCUMENTS

| 8,225,053 B1 | 7/2012 | McCorkendale et al. |
| 2003/0131206 A1* | 7/2003 | Atkinson ................ G06F 12/08 |
| | | 711/156 |

(Continued)

FOREIGN PATENT DOCUMENTS

| CN | 1877548 A | 12/2006 |
| CN | 101000581 A | 7/2007 |

(Continued)

OTHER PUBLICATIONS

"ARM® Cortex®-A57 MPCore™Processor Revision:r1p1—Technical Reference Manual," XP055253268, ARM (2013).

(Continued)

*Primary Examiner* — Hong C Kim
(74) *Attorney, Agent, or Firm* — Leydig, Voit & Mayer, Ltd.

(57) ABSTRACT

A data processing apparatus is provided, comprising a processor configured to execute a process, in particular with at least one thread, a memory management unit component configured to access a page table, and a page fault handler configured to handle page faults by triggering a page fault in response to detecting one of a plurality of predefined bit patterns in the page table, and by assigning a different page fault operation for the process, in particular with the at least one thread, to each of the plurality of predefined bit patterns.

17 Claims, 4 Drawing Sheets

(51) Int. Cl.
*G06F 12/08* (2016.01)
*G11C 29/44* (2006.01)
*G11C 29/12* (2006.01)

(58) Field of Classification Search
USPC .................. 711/206, 156; 710/260, 261, 264
See application file for complete search history.

(56) References Cited

U.S. PATENT DOCUMENTS

| | | | | |
|---|---|---|---|---|
| 2004/0003324 | A1* | 1/2004 | Uhlig | G06F 11/0751 |
| | | | | 714/38.13 |
| 2006/0200863 | A1* | 9/2006 | Ray | G06F 12/145 |
| | | | | 726/24 |
| 2007/0150695 | A1* | 6/2007 | Kim | G06F 12/08 |
| | | | | 711/203 |
| 2007/0168627 | A1 | 7/2007 | In et al. | |
| 2007/0226450 | A1* | 9/2007 | Engbersen | G06F 12/1483 |
| | | | | 711/203 |
| 2008/0126738 | A1 | 5/2008 | Hepkin et al. | |
| 2010/0332727 | A1 | 12/2010 | Kapil et al. | |
| 2015/0082001 | A1 | 3/2015 | Duncan et al. | |
| 2015/0121046 | A1* | 4/2015 | Kunjan | G06F 9/30043 |
| | | | | 712/225 |
| 2016/0378664 | A1* | 12/2016 | Leslie-Hurd | G06F 12/0844 |
| | | | | 711/118 |
| 2017/0286198 | A9* | 10/2017 | Duluk, Jr. | G06F 11/073 |

FOREIGN PATENT DOCUMENTS

| | | |
|---|---|---|
| CN | 101017461 A | 8/2007 |
| CN | 102460384 A | 5/2012 |
| CN | 102473138 A | 5/2012 |
| CN | 102763090 A | 10/2012 |
| EP | 1811384 A2 | 7/2007 |
| WO | 2015138949 A1 | 9/2015 |

OTHER PUBLICATIONS

Goodacre, "Technology Preview: The ARMv8 Architecture; Background:The ARM architecture," White paper, XP055253258, ARM (Nov. 2011).

"ARM® Architecture Reference Manual-ARMv8, for ARMv8-A architecture profile," ARM Limited (2013).

Bowen et al., "Memory Management of an ARM-based Embedded Real-Time Operating System," Huazhong University of Science and Technology, pp. 1-63 (Jul. 2013). With English abstract.

\* cited by examiner

DATA PROCESSING APPARATUS FOR HANDLING PAGE FAULT USING PREDEFIND BIT PATTERNS AND A METHOD THEREOF

CROSS-REFERENCE TO RELATED APPLICATIONS

This application is a continuation of International Application No. PCT/EP2016/066529, filed on Jul. 12, 2016, which claims priority to European Patent Application No. 15188863.3, filed on Oct. 8, 2015. The disclosures of the aforementioned applications are hereby incorporated by reference in their entireties.

TECHNICAL FIELD

Generally, the embodiments of the present invention relate to a data processing apparatus and a method of operating such a data processing apparatus. More specifically, the present invention relates to a data processing apparatus configured to handle page faults and a corresponding method.

BACKGROUND

A page fault is an exception raised by hardware when a program accesses a memory page that is mapped in a virtual memory address space but not loaded in physical memory. Often, page faults are not errors but rather common and necessary indications to an operating system that the amount of virtual memory available to programs needs to increase. Generally, an operating system handles a page fault by making a required page accessible at a location in physical memory. For example, a page fault handler of the operating system coordinates with a memory management unit of a processor to load the page in virtual memory, such as by retrieving the page from a persistent memory.

SUMMARY

It is an object of the invention to provide a data communication apparatus, a process and a method of operating such a data communication apparatus allowing for an improved handling of page faults.

The foregoing and other objects are achieved by the subject matter of the independent claims. Further implementation forms are apparent from the dependent claims, the description and the figures.

According to a first aspect, the invention relates to a data processing apparatus, the data processing apparatus comprising a processor configured to execute a process, in particular with at least one thread, a memory management unit configured to access a page table, and a page fault handler configured to handle page faults by triggering a page fault in response to detecting one of a plurality of predefined bit patterns in the page table and assigning a different page fault operation for the process, in particular with the at least one thread, to each of the plurality of predefined bit patterns. A predefined bit pattern can also be a single bit, for instance a 1-bit instead of a 0-bit at a predefined position of the page table.

Advantageously, the proposed solution allows handling of page faults in a process-specific way, more specifically in a thread-specific way.

In a first possible implementation form of the data processing apparatus according to the first aspect, the processor comprises a register and the processor is configured to store an indicator in the register that a page fault has been triggered by detecting one of a plurality of predefined bit patterns in the page table.

In a second possible implementation form of the data processing apparatus according to the first implementation form of the first aspect, the processor is further configured to store in the register the predefined bit pattern that has triggered a page fault.

In this implementation form the page fault bit pattern can be extracted directly from a processor register, which allows for a rapid and efficient processing of page faults.

In a third possible implementation form of the data processing apparatus according to the second implementation form of the first aspect, the processor is an ARMv8 processor or an evolved version thereof and the register is provided by the Exception Syndrome Register, wherein the processor is further configured to store the predefined bit pattern that has triggered a page fault in the Instruction Specific Syndrome field of the Exception Syndrome Register in case of a page fault.

In a fourth possible implementation form of the data processing apparatus according to the first aspect as such or any one of the first to third implementation form thereof, the page fault handler is configured to detect the bit pattern among unused bits of the page table.

Advantageously, this implementation form allows implementing the invention in existing page table formats.

In a fifth possible implementation form of the data processing apparatus according to the fourth implementation form of the first aspect, the processor is an ARMv8 processor or an evolved version thereof, wherein the plurality of bits of the page table not used for any other purposes are bits 48 to 51 and/or bits 12 to n−1 of a page table entry of the page table, wherein n is equal to 21 for a page size of 4 KB, 25 for a page size of 16 KB and 29 for a page size of 64 KB.

In a sixth possible implementation form of the data processing apparatus according to the first aspect as such or any one of the first to fifth implementation form thereof, the page fault operation assigned to a bit pattern comprise a termination operation, a scheduling operation and/or a prioritization operation.

According to a second aspect the invention relates to a process, in particular with at least one thread, configured to be executed by a processor of a data processing apparatus according to the first aspect or any implementation form thereof, wherein the process comprises a page fault handler for the data processing apparatus. The process can be an application running on the processor, an operating system running on the processor or a combination thereof.

In a first possible implementation form of the process according to the second aspect, the page fault handler is configured to handle page faults by triggering a page fault in response to detecting one of a plurality of predefined bit patterns in the page table and by assigning a different page fault operation for the process, in particular with the at least one thread, to each of the plurality of predefined bit patterns.

In a second possible implementation form of the process according to the second aspect as such or the first implementation form thereof, the page fault operation comprises a termination operation, a scheduling operation and/or a prioritization operation.

In a third possible implementation form of the process according to the second aspect as such or the first or second implementation form thereof, the process comprises an operating system, wherein the operating system comprises an application programming interface for enabling an application to register a page fault handler with the operating system.

Advantageously, an operating system API provides an easy mechanism for registering a page fault handler with the operating system.

In a fourth possible implementation form of the process according to the third implementation form of the second aspect, the application programming interface is configured to provide a function for registering a page fault handler with the operating system, wherein the function takes as arguments the plurality of predefined bit patterns and the different page fault operations assigned to the plurality of predefined bit patterns.

Providing a function as part of the API constitutes a convenient mechanism for an application to define different page fault bit patterns as well as the page fault operations assigned thereto.

According to a third aspect the invention relates to a method of operating a data processing apparatus, the method comprising the steps of executing a process, in particular with at least one thread, on a processor, accessing a page table using a memory management unit, and handling page faults by triggering a page fault in response to detecting one of a plurality of predefined bit patterns in the page table and by assigning a different page fault operation for the process, in particular with the at least one thread, to each of the plurality of predefined bit patterns using a page fault handler.

The invention can be implemented in hardware and/or software.

BRIEF DESCRIPTION OF THE DRAWINGS

Further embodiments of the invention will be described with respect to the following figures, in which.

DETAILED DESCRIPTION OF EMBODIMENTS

In the following detailed description, reference is made to the accompanying drawings, which form a part of the disclosure, and in which are shown, by way of illustration, specific aspects in which the present invention may be practiced. It is understood that other aspects may be utilized and structural or logical changes may be made without departing from the scope of the present invention. The following detailed description, therefore, is not to be taken in a limiting sense, as the scope of the present invention is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
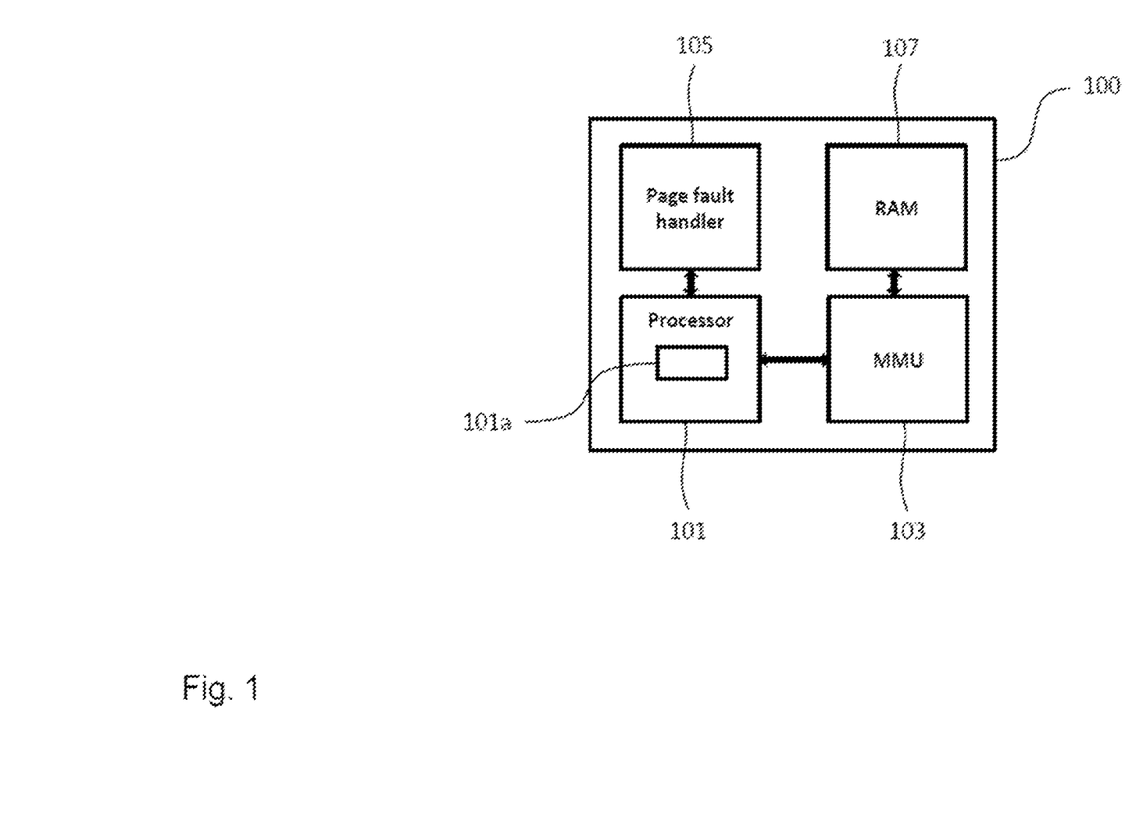
FIG. 1 shows a schematic diagram illustrating a data processing apparatus according to an embodiment.

FIG. 1 shows a schematic diagram of a data processing apparatus 100. The data processing apparatus 100 comprises a processor 101 configured to execute a process, in particular with at least one thread. In an embodiment, the process can be an operating system, an application or a combination thereof.

The data processing apparatus 100 further comprises a memory management unit 103 configured to access a page table, for instance, in response to a virtual address call by the process. In an embodiment, the memory management unit 103 can be implemented as part of the processor 101. In an embodiment, the memory management unit 103 is configured to map virtual addresses into physical addresses on the basis of a page table. In an embodiment, the page table can reside in a memory, such as a RAM, 107 of the data processing apparatus 100.

The data processing apparatus 100 further comprises a page fault handler 105 configured to handle page faults by triggering a page fault in response to detecting one of a plurality of predefined bit patterns in the page table and assigning a different page fault operation for the process, in particular with the at least one thread, to the plurality of predefined bit patterns. Possible predefined bit patterns could be, for instance, 0x101, 0x01, 0x1101 and the like. However, a predefined bit pattern can also be a single bit, for instance a 1-bit instead of a 0-bit at a predefined position of the page table. Different page fault operations can be assigned to these different bit patters. However, the present invention also covers embodiments, where two different bit patterns are assigned to the same page fault operation, as long as there is at least one further bit pattern assigned to a different page fault operation.

In an embodiment, the processor 101 comprises a register 101a and the processor 101 is configured to store an indicator, for instance a flag, in the register 101a that a page fault has been triggered by detecting one of the plurality of predefined bit patterns in the page table.

In an embodiment, the processor 101 is further configured to store in the register 101a the predefined bit pattern that has triggered a page fault.

Figure 2A:
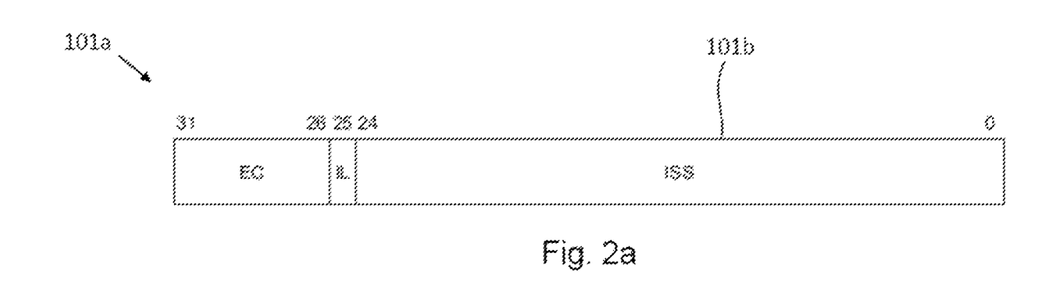
FIG. 2a shows an exemplary processor register of a data processing apparatus according to an embodiment.

In an embodiment, the processor 101 is an ARMv8 processor or an evolved version thereof and the register 101a is provided by the Exception Syndrome Register of the ARMv8 processor. FIG. 2a shows a schematic diagram of the Exception Syndrome Register 101a of the ARMv8 processor. In an embodiment, the processor 101 in the form of an ARMv8 processor or an evolved version thereof is further configured to store the predefined bit pattern that has triggered a page fault in the Instruction Specific Syndrome 101b field of the Exception Syndrome Register 101a in case of a page fault.

Figure 2B:
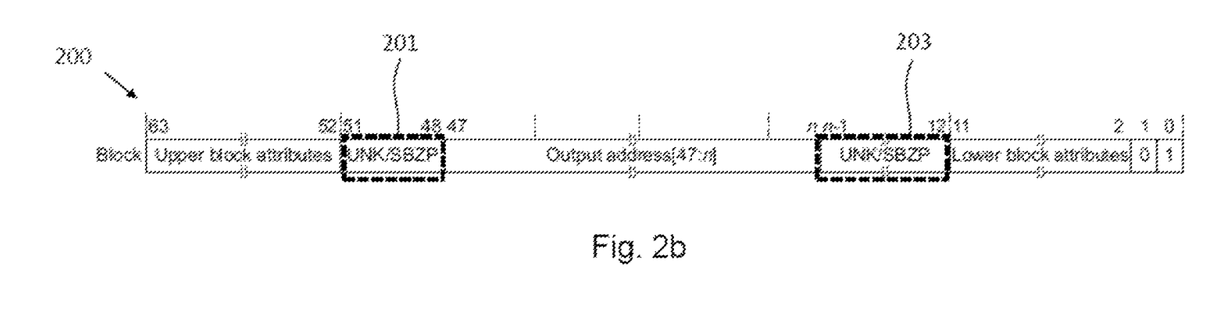
FIG. 2b shows an exemplary page fault entry that can be used in the context of a data processing apparatus according to an embodiment.

In an embodiment, the page fault handler 105 is configured to detect the bit pattern among unused bits of the page table. In an embodiment, the processor 101 is an ARMv8 processor or an evolved version thereof. FIG. 2b shows a schematic diagram of a page table entry 200 of a page table used by the ARMv8 processor. In an embodiment, where the processor 101 is an ARMv8 processor or an evolved version thereof, the page fault handler 105 is configured to detect the page fault triggering bit pattern among the unused bits of the page table entry 200 shown in FIG. 2b, namely bits 48 to 51 and/or bits 12 to n−1 of the page table entry 200, wherein n is equal to 21 for a page size of 4 KB, 25 for a page size of 16 KB and 29 for a page size of 64 KB.

In an embodiment, the page fault operation assigned to a bit pattern can comprise a termination operation, a scheduling operation and/or a prioritization operation.

As already mentioned above, the processor 101 of the data processing apparatus 100 shown in FIG. 1 is configured to execute a process. In an embodiment, the process can have at least one thread. The process can comprise a page fault handler and, thus, provide the page fault handler 105 of the data processing apparatus 100 shown in FIG. 1.

In an embodiment, the page fault handler 105 provided by the process is configured to handle page faults by triggering a page fault in response to detecting one of a plurality of predefined bit patterns in the page table and by assigning a different page fault operation for the process, in particular with the at least one thread, to each of the plurality of predefined bit patterns.

In an embodiment, the page fault operation triggered by the page fault handler 105 provided by the process can comprises a termination operation, a scheduling operation and/or a prioritization operation.

In an embodiment, the process can comprise an operating system, wherein the operating system comprises an application programming interface for enabling an application to register an application-specific page fault handler with the operating system and, thus, provide the page fault handler 105 of the data processing apparatus 100.

In an embodiment, the application programming interface provided by the operating system is configured to provide a function for registering an application-specific page fault handler with the operating system and, thereby, provide the page fault handler 105 of the data processing apparatus 100, wherein the function takes as arguments the plurality of predefined bit patterns and the different page fault operations assigned to the plurality of predefined bit patterns.

Figure 3:
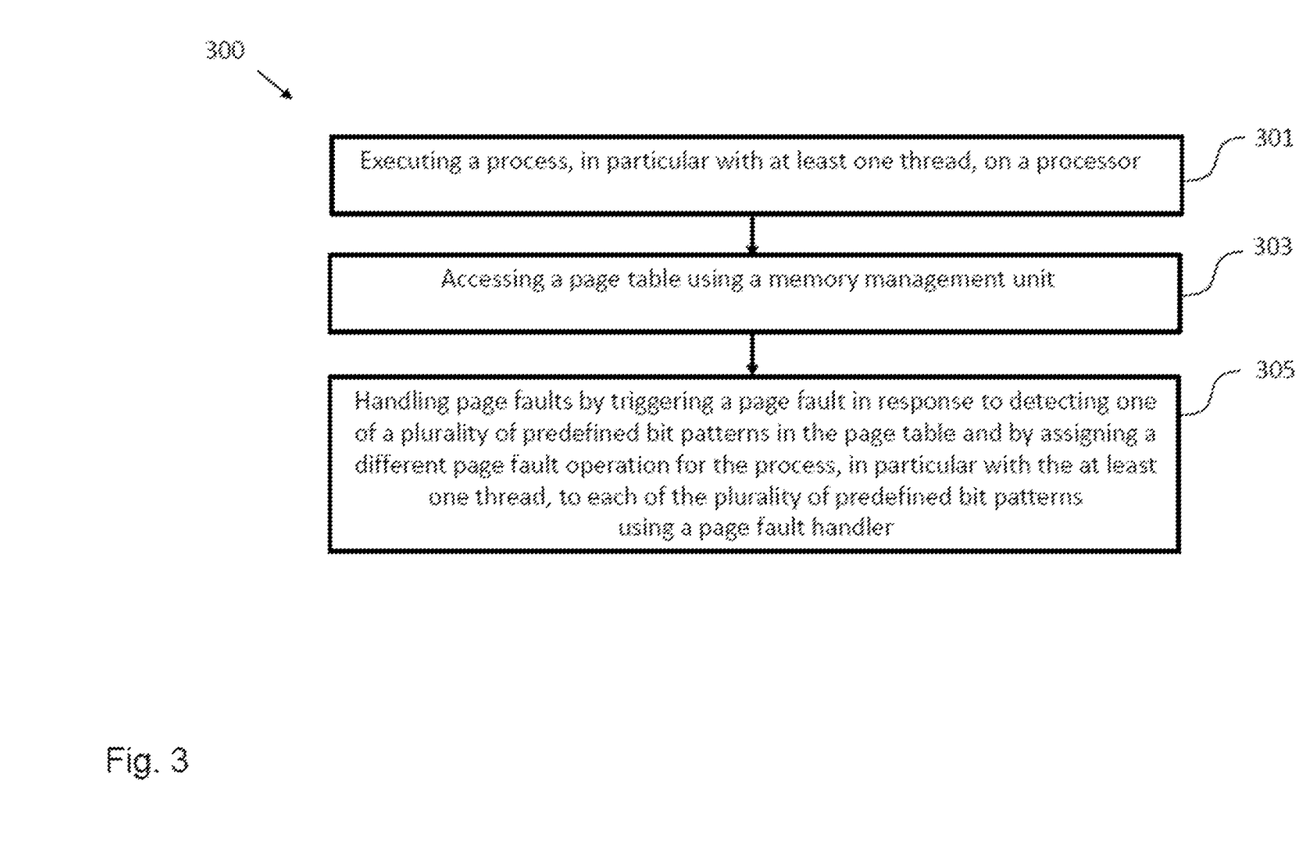
FIG. 3 shows a schematic diagram illustrating steps of a method of operating a data processing apparatus according to an embodiment.

FIG. 3 shows a schematic diagram illustrating steps of a method 300 of operating the data processing apparatus 100 according to an embodiment. The method 300 comprises a step 301 of executing a process, in particular with at least one thread, on the processor 101 of the data processing apparatus 100. The method 300 comprises a further step 303 of accessing a page table using the memory management unit 103. The method comprises a further step 305 of handling page faults by triggering a page fault in response to detecting one of a plurality of predefined bit patterns in the page table and by assigning a different page fault operation for the process, in particular with the at least one thread, to the plurality of predefined bit patterns using the page fault handler 105.

Figure 4:
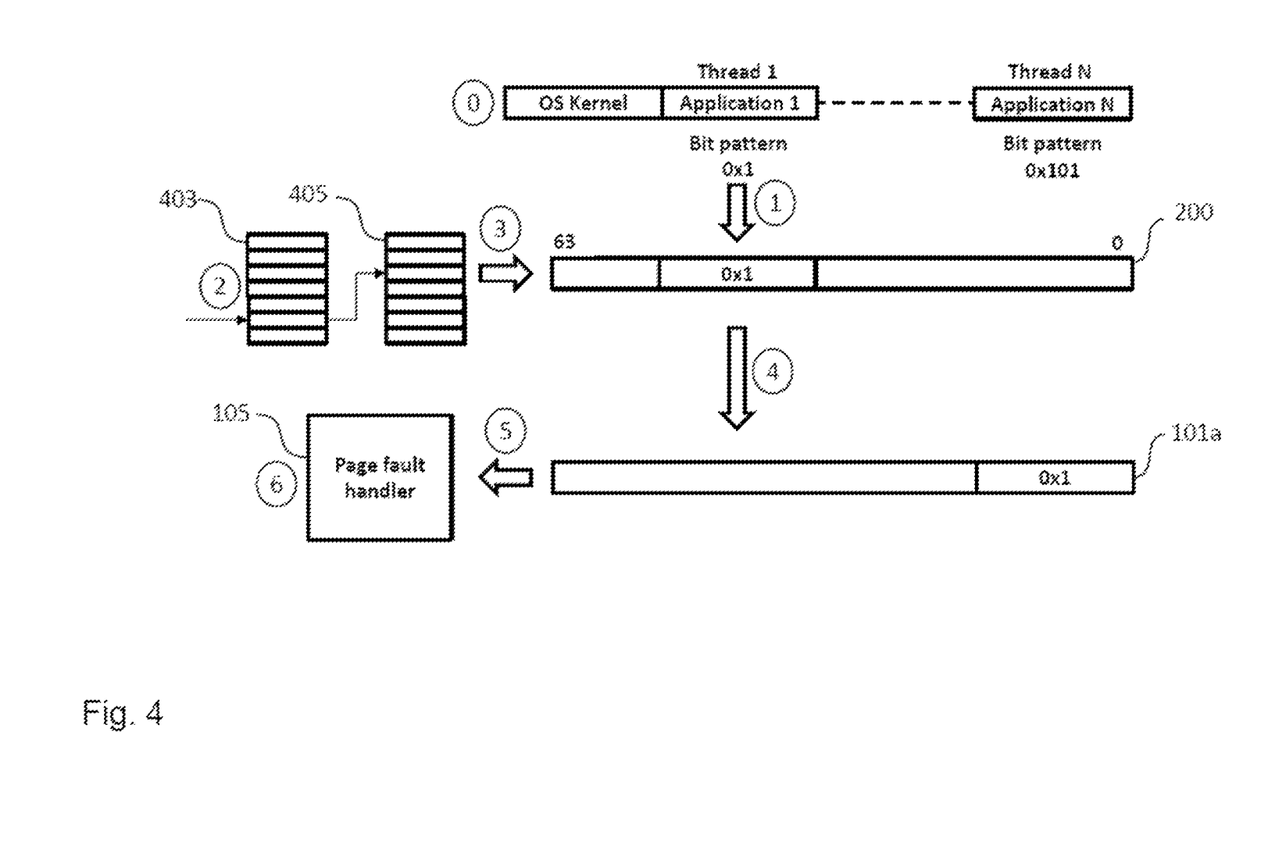
FIG. 4 shows a schematic diagram illustrating different aspects of a data processing apparatus and a method of operating a data processing apparatus according to an embodiment.

FIG. 4 shows a schematic diagram of a scenario illustrating different aspects of the data processing apparatus 100 according to an embodiment and the method 300 of operating the data processing apparatus 100 according to an embodiment.

In the scenario shown in FIG. 4, an operating system kernel and a plurality of applications can be executed by the data processing apparatus 100. In an embodiment, each of these applications can define a thread that runs in the same address space as the operating system kernel (identified as stage "0" in FIG. 4). In an embodiment, each application can specify its own page fault bit pattern(s), such as the bit pattern 0x1 for Application 1 and the bit pattern 0x101 for the Application N, that is/are mapped into the page table entries that belong to this application, such as the page table entry 200 shown in FIG. 4 (identified as state "1" in FIG. 4). In an embodiment, an application can register its own page fault handler for its own page fault bit pattern(s) with the operating system kernel. In case an application accesses a virtual address, which corresponds to a page table entry with an application-specific page fault bit pattern (identified as stages "2" and "3" in FIG. 4), then, in an embodiment, an application-specific page fault is triggered (identified as stage "4" in FIG. 4). In an embodiment, the page fault handler 105 reads the page fault triggering bit pattern from the processor register 101a in order to identify the application-specific bit pattern that caused the page fault. In an embodiment the page fault bit pattern can be written into a bitmask argument of a page fault handler function, such as the page fault handler function specified by the ARMv8 Procedure Call Standard (identified as stage "5" in FIG. 4). In response thereto, in an embodiment, the page fault handler 105 can perform the following operations (identified as stage "6" in FIG. 4). In case the bitmask is zero, the page fault handler 105 can follow a default page fault handling, as defined, for instance, by the operating system kernel. In case the bitmask is non zero, the page fault handler 105 can read from thread local storage the pointer to the thread structure, read from the thread structure the registered bit patterns and compare them with the bitmask parameters. If a match is found a registered page fault handler can be called. In case no page fault handler is found, an error message can be reported. In order to speed up the page fault handling a single field in thread's structure could identify if any application specific page fault handlers is set. If not, then default page fault handling can be followed.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A data processing apparatus comprising:
a processor configured to execute a process with at least one thread;
a memory management component configured to access a page table; and
a page fault handler configured to handle page faults by:
triggering a page fault in response to detecting one of a plurality of predefined bit patterns among unused bits of the page table; and
assigning a different page fault operation for the process with the at least one thread, to each of the plurality of predefined bit patterns.

2. The data processing apparatus of claim 1, wherein the processor comprises a register and the processor is configured to store an indicator in the register that a page fault has been triggered by detecting one of the plurality of predefined bit patterns in the page table.

3. The data processing apparatus of claim 2, wherein the processor is further configured to store in the register the predefined bit pattern that has triggered a page fault.

4. The data processing apparatus of claim 3, wherein the processor is an ARMv8 processor or an evolved version thereof and the register is provided by the Exception Syndrome Register, wherein the processor is further configured to store the predefined bit pattern that has triggered a page fault in the Instruction Specific Syndrome field of the Exception Syndrome Register.

5. The data processing apparatus of claim 1, wherein the processor is an ARMv8 processor or an evolved version thereof, and wherein the unused bits of the page table are bits 48 to 51 and/or bits 12 to n–1 of a page table entry of the page table, wherein n is equal to 21 for a page size of 4 KB, 25 for a page size of 16 KB, and 29 for a page size of 64 KB.

6. The data processing apparatus of claim 1, wherein the page fault operation assigned to a bit pattern comprises a termination operation, a scheduling operation and/or a prioritization operation.

7. A method of operating a data processing apparatus, wherein the apparatus comprises a processor, a memory management component and a page fault handler, the method comprises:
executing, by the processor, a process with at least one thread;
accessing, by the memory management component, a page table; and
handling page faults, by the page fault handler, including:
triggering a page fault in response to detecting one of a plurality of predefined bit patterns among unused bits of the page table; and
assigning a different page fault operation for the process with the at least one thread, to each of the plurality of predefined bit patterns.

8. The method according to claim 7, further comprising:
storing an indicator in a register comprised in the processor, that a page fault has been triggered by detecting one of the plurality of predefined bit patterns in the page table.

9. The method according to claim 8, further comprising:
storing in the register the predefined bit pattern that has triggered a page fault.

10. The method according to claim 9, wherein the processor is an ARMv8 processor or an evolved version thereof and the register is provided by the Exception Syndrome Register, wherein the method further comprises:
storing, by the processor, the predefined bit pattern that has triggered a page fault in the Instruction Specific Syndrome field of the Exception Syndrome Register.

11. The method according to claim 7, wherein the processor is an ARMv8 processor or an evolved version thereof, and wherein the unused bits of the page table are bits 48 to 51 and/or bits 12 to n–1 of a page table entry of the page table, wherein n is equal to 21 for a page size of 4 KB, 25 for a page size of 16 KB, and 29 for a page size of 64 KB.

12. The method according to claim 7, wherein the page fault operation assigned to a bit pattern comprises a termination operation, a scheduling operation and/or a prioritization operation.

13. A non-transitory computer readable medium comprising computer-executed instructions that, when executed by a data processing apparatus, cause the apparatus to implement operations including:
executing a process with at least one thread;
accessing a page table; and
handling page faults, including:
triggering a page fault in response to detecting one of a plurality of predefined bit patterns among unused bits of the page table; and
assigning a different page fault operation for the process with the at least one thread, to each of the plurality of predefined bit patterns.

14. The non-transitory computer readable medium according to claim 13, wherein the operations further comprise:
storing an indicator in a register comprised in a processor of the apparatus, that a page fault has been triggered by detecting one of the plurality of predefined bit patterns in the page table.

15. The non-transitory computer readable medium according to claim 14, wherein the operations further comprise: storing in the register the predefined bit pattern that has triggered a page fault.

16. The non-transitory computer readable medium according to claim 15, wherein the operations further comprise:
storing, the predefined bit pattern that has triggered a page fault in an Instruction Specific Syndrome field of an Exception Syndrome Register.

17. The non-transitory computer readable medium according to claim 13, wherein the page fault operation assigned to a bit pattern comprises a termination operation, a scheduling operation and/or a prioritization operation.

* * * * *

UNITED STATES PATENT AND TRADEMARK OFFICE
CERTIFICATE OF CORRECTION

PATENT NO. : 10,970,227 B2
APPLICATION NO. : 15/948393
DATED : April 6, 2021
INVENTOR(S) : Kokkonen Page 1 of 1

It is certified that error appears in the above-identified patent and that said Letters Patent is hereby corrected as shown below:

On the Title Page

Abstract (57), Line 3: "at least one thread, a memory management unit component" should read -- at least one thread, a memory management component --.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*